United States Patent
Mizutani et al.

(10) Patent No.: US 7,176,142 B2
(45) Date of Patent: Feb. 13, 2007

(54) METHOD OF MANUFACTURING TRENCH STRUCTURE FOR DEVICE

(75) Inventors: Nobutaka Mizutani, Nirasaki (JP); Fitrianto, Nirasaki (JP); Isao Tsukagoshi, Nirasaki (JP); Keizo Hirose, Nirasaki (JP); Satohiko Hoshino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 204 days.

(21) Appl. No.: 10/455,344

(22) Filed: Jun. 6, 2003

(65) Prior Publication Data
US 2004/0002214 A1   Jan. 1, 2004

(30) Foreign Application Priority Data
Jun. 26, 2002 (JP) .............................. 2002-185926
Oct. 8, 2002 (JP) .............................. 2002-294595

(51) Int. Cl.
*H01L 21/302* (2006.01)
(52) U.S. Cl. ................. 438/745; 438/756; 438/757
(58) Field of Classification Search ............... 438/706, 438/710, 714, 723, 724, 745, 755, 756, 757
See application file for complete search history.

(56) References Cited
U.S. PATENT DOCUMENTS 5,464,480 A * 11/1995 Matthews ................. 134/1.3
6,030,541 A * 2/2000 Adkisson et al. ............. 216/51
6,083,835 A * 7/2000 Shue et al. .................. 438/687
6,245,155 B1 * 6/2001 Leon et al. ..................... 134/3
6,383,923 B1 * 5/2002 Brown et al. ............... 438/666
6,514,880 B2 * 2/2003 Matsuki et al. ............. 438/780
6,517,998 B1 * 2/2003 Noda et al. ................. 430/329
6,616,773 B1 * 9/2003 Kuzumoto et al. ........... 134/26
6,815,329 B2 * 11/2004 Babich et al. .............. 438/619
2003/0162408 A1 * 8/2003 Matsuki et al. ............. 438/758
2004/0038514 A1 * 2/2004 Hyodo et al. ............... 438/623

* cited by examiner

*Primary Examiner*—Kin-Chan Chen
(74) *Attorney, Agent, or Firm*—Smith, Gambrell & Russell, LLP (57) ABSTRACT

A porous low-k film, a sacrificial film that can be dissolved in a pure water, an antireflection film and a resist film are successively formed on a dielectric film on a wafer and subsequently exposing the resist film to light in a prescribed pattern and developing the resist film so as to form a prescribed circuit pattern in the resist film. Then, the wafer W is etched so as to form a via hole in the porous low-k film, followed by processing the wafer with a hydrogen peroxide solution so as to denature the resist film. Further, the sacrificial film is dissolved in a pure water so as to strip the resist film and the antireflection film from the water. As a result, a via hole excellent in the accuracy of the shape is formed without doing damage to the dielectric film.

16 Claims, 7 Drawing Sheets

METHOD OF MANUFACTURING TRENCH STRUCTURE FOR DEVICE

BACKGROUND OF THE INVENTION

1. Field of the Invention

The present invention relates to a method of manufacturing a trench structure for a device for forming a trench interconnection element such as a damascene structure.

2. Description of the Related Art

Figure 8A:
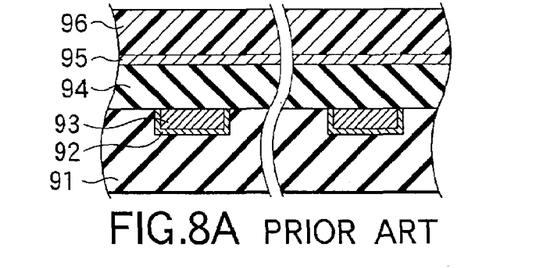
FIGS. 8A to 8E are cross sectional views collectively showing schematically the process of manufacturing a semiconductor device by the conventional damascene method.

In the manufacturing process of a semiconductor device, a single damascene process or a dual damascene process is widely employed for forming a multilevel interconnection. FIGS. 8A to 8E collectively exemplify a process of forming a multilevel interconnection by the single damascene process. In the first step, a lower interconnection 93 made of, for example, copper is formed in a surface portion of a dielectric film 91 formed on a semiconductor wafer W (not shown) with a barrier metal layer 92 interposed between the dielectric film 91 and the lower interconnection 93, followed by forming a dielectric film 94 on the surfaces of the dielectric film 91 including the lower interconnection 93 and subsequently forming a bottom anti-reflective coating (BARC) film 95, as shown in FIG. 8A. Further, a resist film 96 is formed on the BARC film 95.

Figure 8B:
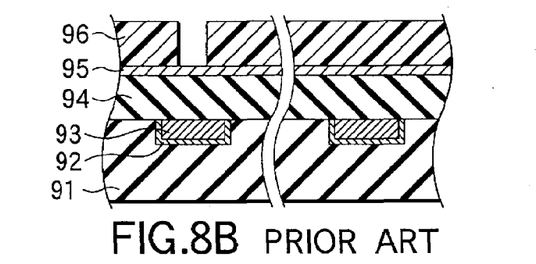
Figure 8C:
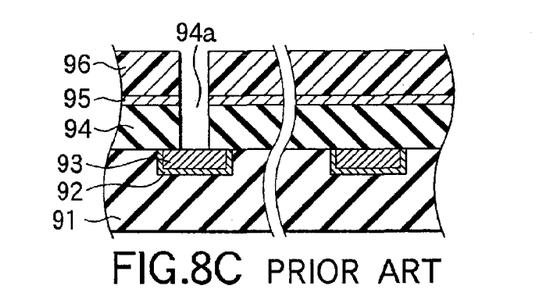
Figure 8D:
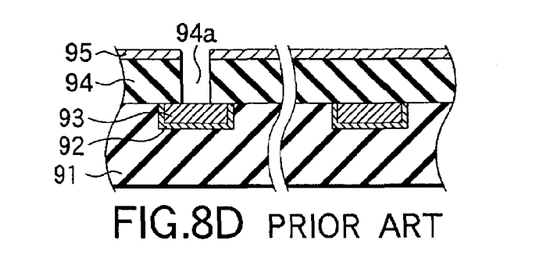

In the next step, the resist film 96 is exposed in a prescribed circuit pattern, followed by developing the resist film so as to form a prescribed circuit pattern in the resist film 96, as shown in FIG. 8B. The wafer W thus obtained is etched so as to form a via hole 94a in the dielectric film 94. The etching treatment is continued until the via hole 94a extends to permit the lower interconnection 93 to be exposed to the outside, as shown in FIG. 8C. Then, the resist film 96 is dissolved in a solvent so as to be removed, as shown in FIG. 8D.

Figure 8E:
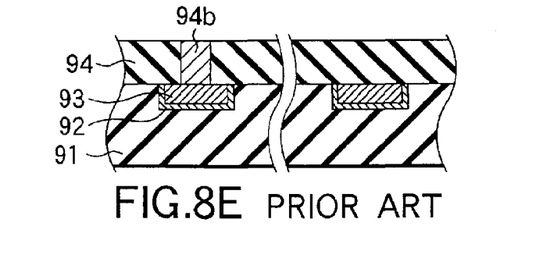

Further, an electrically conductive thin film is formed until the via hole 94a is filled with an electrically conductive material 94b, as shown in FIG. 8E. Then, a planarizing treatment such as a CMP (Chemical Mechanical Polishing) treatment is applied so as to remove the BARC film 95 from the wafer W and to form a trench interconnection that permits the lower interconnection 93 to be electrically connected to the electrically conductive material 94b within the via hole 94a. The particular method of forming a trench interconnection element is disclosed in, for example, JP 2000-232106.

In the development of a semiconductor device using such a damascene process, a dielectric film having a low dielectric constant such as a low-k film or a low-ε film has come to be used for forming the dielectric film 94 in an attempt to improve the speed of the arithmetic processing or to lower the power consumption. Further, in the development in recent years of a semiconductor device such as an LSI, it is attempted to use a porous low-k film having a relative dielectric constant much lower than that of the conventional low-k film for forming the dielectric film 94 in order to improve the speed of the arithmetic processing.

However, where a porous low-k film is formed and a via hole is formed in the porous low-k film by the damascene process described above, the porous low-k film is corroded in the subsequent step of removing the resist film by the treatment with a chemical liquid, giving rise to the problem that the shape of the via hole cannot be retained.

Also, as another method of removing the resist film, known is a method of removing the resist film 96 by an ashing treatment. However, the porous low-k film tends to incur damages by the ashing treatment so as to give rise to the problems that the dielectric constant is increased and that it is difficult to maintain the dimensional accuracy in the shape of the trench. In addition, the ashing treatment is defective in that the through-put is low.

BRIEF SUMMARY OF THE INVENTION

A first object of the present invention is to provide a method of manufacturing a trench structure for a device, which permits easily manufacturing a device including a trench interconnection element excellent in the accuracy of the shape without doing damage to the dielectric film. Also, a second object of the present invention is to provide a method of manufacturing a trench structure for a device, which permits improving the through-put.

According to a first aspect of the present invention, there is provided a method of manufacturing a trench structure for a device including a trench for the interconnection, comprising the steps of:

forming a dielectric film on a substrate;

forming a sacrificial film on the dielectric film;

forming an etching mask having a prescribed pattern on the sacrificial film;

etching the substrate thereby forming a via hole in the dielectric film; and treating the substrate with a liquid capable of dissolving the sacrificial film so as to dissolve the sacrificial film, thereby stripping the etching mask from the substrate.

Further, according to a second aspect of the present invention, there is provided a method of manufacturing a trench structure for a device including a trench for the interconnection, comprising the steps of:

forming a dielectric film on a substrate;

forming a sacrificial film on the dielectric film;

forming an antireflection film on the sacrificial film;

forming a resist film on the antireflection film;

exposing the resist film to light in a prescribed pattern, followed by developing the resist film thereby forming a prescribed circuit pattern in the resist film;

etching the substrate to form a via hole in the dielectric film; and treating the substrate with a liquid capable of dissolving the sacrificial film so as to dissolve the sacrificial film, thereby stripping the antireflection film and the resist film from the substrate.

According to the method of manufacturing a trench structure for a device defined in the present invention, it is possible to strip easily the undesired films on the dielectric film without doing damage to the dielectric film by dissolving the sacrificial film after the etching treatment in forming a trench interconnection element such as a damascene structure, thereby forming a via hole having a high accuracy of the shape. It follows that the generation of the defective devices can be suppressed so as to improve the reliability of the device. Also, the through-put of the processing can be improved so as to lower the manufacturing cost.

DETAILED DESCRIPTION OF THE INVENTION

Some embodiments of the present invention will now be described in detail with reference to the accompanying drawings. The following description covers the case of manufacturing a semiconductor device in which a trench interconnection element of a damascene structure is formed in a porous low-k film.

Figure 1:
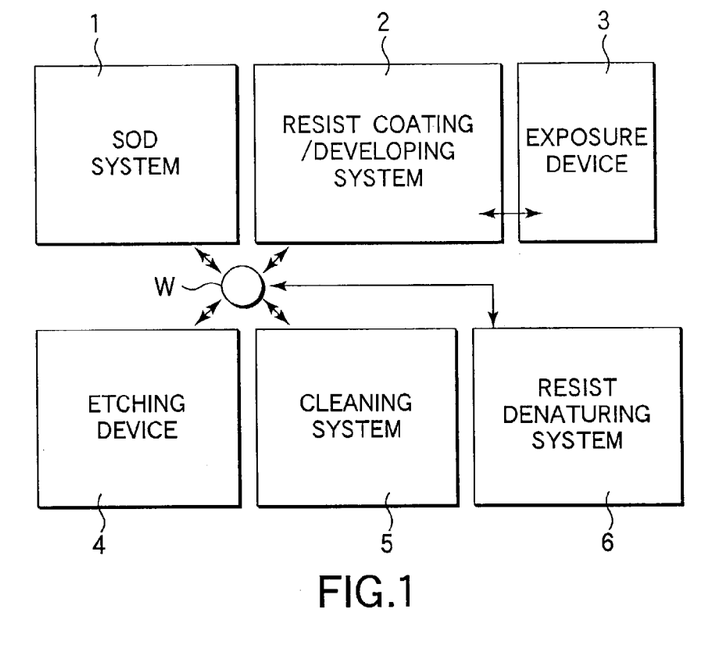
FIG. 1 schematically shows the construction of a damascene forming system.
Figure 2:
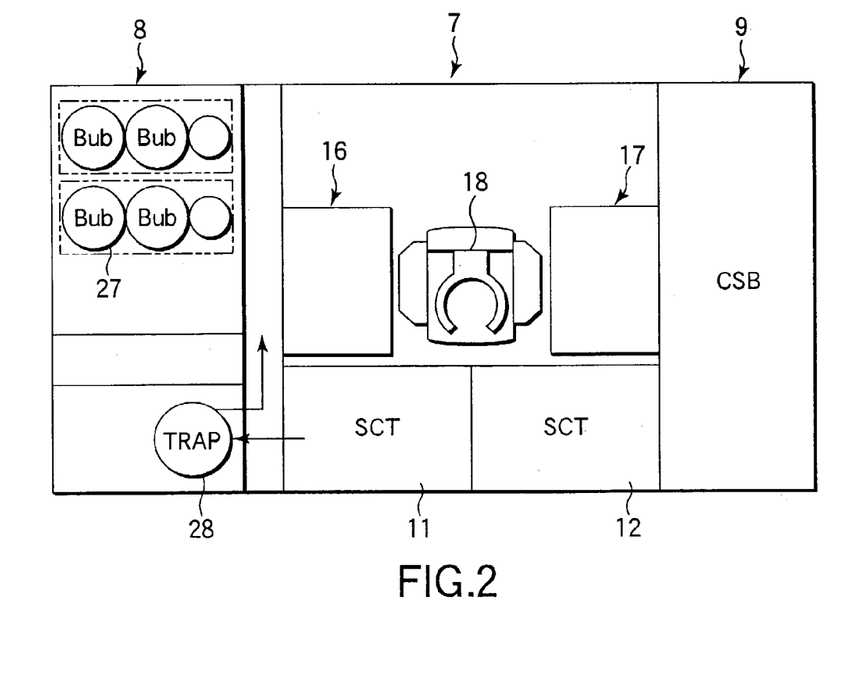
FIG. 2 is a plan view schematically showing the construction of an SOD system provided with the damascene forming system shown in FIG. 1.
Figure 3:
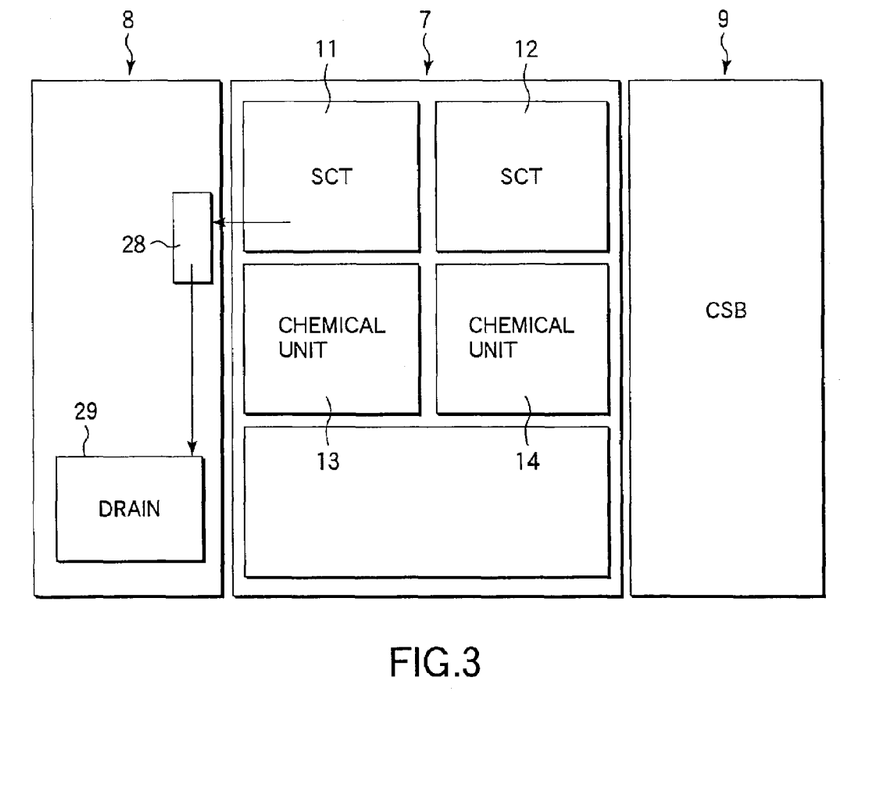
FIG. 3 is a side view schematically showing the construction of the SOD system shown in FIG. 2.
Figure 4:
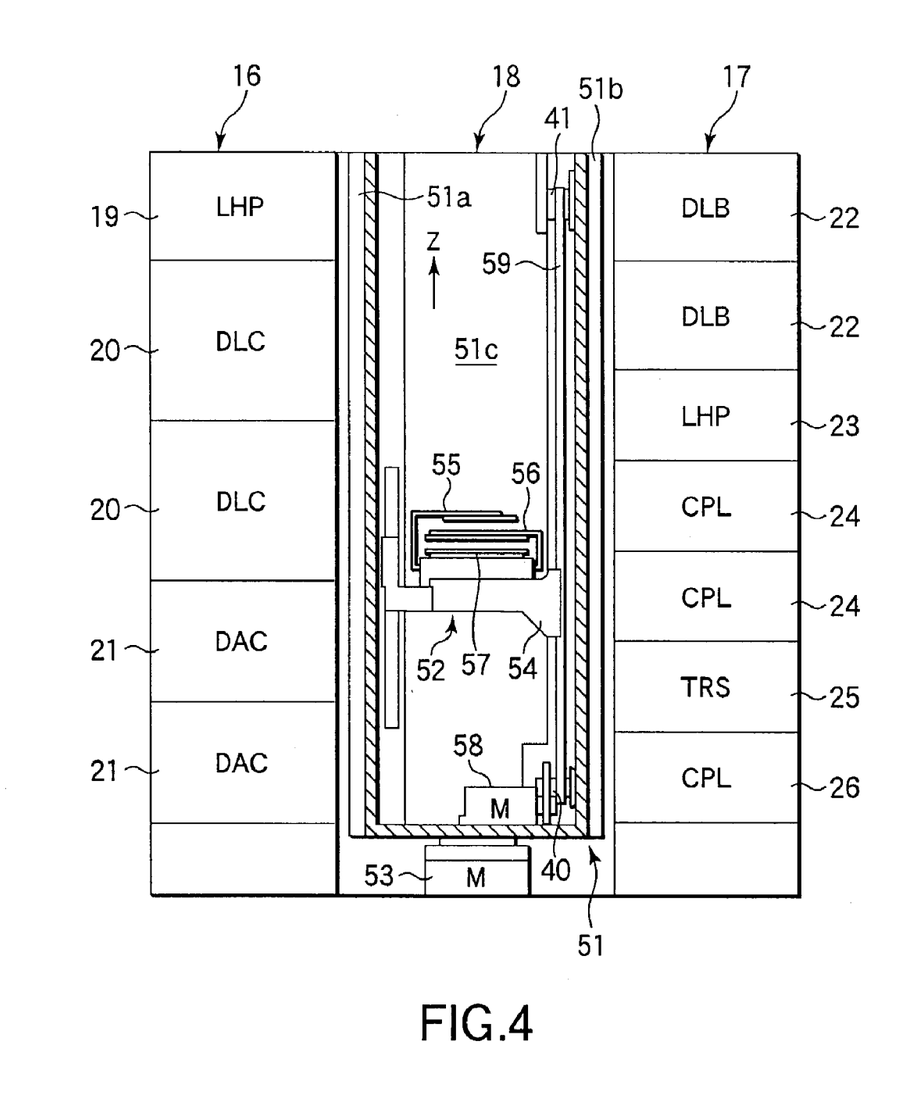
FIG. 4 is a side view showing the process unit groups mounted within the SOD system.

FIG. 1 schematically shows the construction of a damascene forming system used for forming a porous low-k film and for forming a via hole in the porous low-k film. FIG. 2 is a plan view schematically showing the construction of an SOD system provided with the damascene forming system shown in FIG. 1. FIG. 3 is a side view schematically showing the SOD system. Further, FIG. 4 is a side view showing the process unit groups mounted in the SOD system.

The damascene forming system comprises an SOD system 1, a resist coating/developing system 2, an exposure device 3, an etching device 4, a cleaning system 5, and a resist denaturing system 6, and is constructed to permit a wafer W to be transferred among these systems and devices.

As described herein later in detail, the SOD system 1 is used for forming a porous low-k film and a sacrificial film on the wafer W.

The resist coating/developing system 2 includes, for example, a resist coating unit for coating the wafer W with a photoresist solution so as to form a resist film, a BARC coating unit for forming a BARC film on the wafer W, a developing process unit for developing a resist film exposed to light in a prescribed pattern in the exposure device 3, and a thermal process unit for thermally processing each of the wafer W having a resist film formed thereon, the exposed wafer W, the developed wafer W, and the wafer W having a BARC film formed thereon.

The exposure device 3 is used for exposing the wafer W having a resist film formed thereon to light in a prescribed circuit pattern. Also, the etching device 4 is used for etching the various films formed on the wafer W.

The cleaning system 5 is equipped with, for example, a resist removing unit for stripping the resist film and the BARC film, etc., which have been rendered useless in the manufacturing process of the semiconductor device, from the wafer W and with a residue removing unit for removing the residue after the etching treatment.

The resist denaturing system 6 is equipped with two kinds of process units for performing a pretreatment in stripping, for example, the resist film and the BARC film from the wafer W in the resist removing unit included in the cleaning system 5. One of the two kinds of the process units is a VOS unit, i.e., a unit for processing the wafer W with a mixed gas consisting of an ozone gas ($O_3$) and a water vapor so as to do damage to, for example, the resist film and the BARC film formed on the wafer W. The other process unit is a chemical liquid processing unit, i.e., a unit for processing the wafer W with a prescribed chemical liquid so as to do damage to, for example, the resist film and the BARC film formed on the wafer W.

The SOD system 1 will now be described in detail. The SOD system 1 includes a process section 7, a side cabinet 8 and a carrier station (CSB) 9. As shown in FIGS. 2 and 3, coating units (SCT) 11 and 12 each used for forming a film on the wafer W by a spin coating method are arranged in the upper portion on the front side of the process section 7. Each of the coating units (SCT) 11 and 12 includes a spin chuck for holding the wafer W substantially horizontal, a rotating mechanism for rotating the spin chuck about a vertical axis, and a chemical liquid supply device for supplying a chemical liquid for forming a film to the wafer W held by the spin chuck.

For example, the coating unit (SCT) 11 is used for forming a porous low-k film, and the coating unit (SCT) 12 is used for forming a sacrificial film. Incidentally, the term "sacrificial film" denotes a film, which is formed temporarily for smoothly carrying out the process step without adversely affecting the characteristics of the other films and which is removed after completion of a prescribed processing. Incidentally, the resist coating unit and the BARC coating unit included in the resist coating/developing system 2 are substantially equal in construction to the coating units (SCT) 11 and 12.

Chemical units 13 and 14 housing a chemical liquid used in the coating units (SCT) 11, 12 and also housing, for example, a pump for supplying the chemical liquid into the coating units (SCT) 11, 12 are arranged below the coating units (SCT) 11, 12.

As shown in FIGS. 2 and 4, process unit groups 16 and 17 each consisting of a plurality of process units that are stacked one upon the other to form a multistage structure are arranged in the central portion of the process section 7, and a main wafer transfer device 18 that is moved in the vertical direction for transferring the wafer W is arranged between the process unit groups 16 and 17.

The main wafer transfer device 18 includes vertical walls 51a and 51b extending in the Z-direction, a cylindrical support body 51 having a side surface open portion 51c positioned between the vertical walls 51a and 51b, and a wafer transfer body 52 arranged inside the cylindrical support body 51 so as to be movable in the Z-direction along the cylindrical support body 51. The cylindrical support body 51 can be rotated by a motor 53, and the wafer transfer body 52 can also be rotated in accordance with rotation of the cylindrical support body 51.

The wafer transfer body 52 includes a transfer base 54 and three wafer transfer arms 55, 56 and 57 movable back and forth along the transfer base 54. Each of the wafer transfer arms 55 to 57 is sized such that these wafer transfer arms are capable of passing through the side surface open portion 51c of the cylindrical support body 51. Each, of the wafer transfer arms 55 to 57 is capable of being moved back and forth independently by a motor and a belt mechanism housed in the transfer base 54. A belt 59 is driven by a motor 58 so as to move the wafer transfer body 52 in the vertical direction. Incidentally, a reference numeral 40 denotes a driving pulley, and a reference numeral 41 denotes a driven pulley.

As shown in FIG. 4, the process unit group 16 on the left side in FIG. 2 includes a hot plate unit (LHP) 19 for a low temperature, two curing units (DLC) 20, and two aging units (DAC) 21, which are stacked one below the other in the order mentioned as viewed from the uppermost unit of the hot plate unit (LHP) 19. On the other hand, the process unit group 17 on the right side in FIG. 2 includes two baking units (DLB) 22, a hot plate unit (LHP) 23 for a low temperature, two cooling plate units (CPL) 24, a delivery unit (TRS) 25, and a cooling plate unit (CPL) 26, which are stacked one below the other in the order mentioned as viewed from the uppermost unit of the baking unit (DLB) 22. Incidentally, it is possible for the delivery unit (TRS) 25 to perform the function of a cooling plate as well as the wafer delivering function. Also, it is possible to arrange a hot plate unit (OHP) for a high temperature in place of the baking unit (DLB) 22.

The side cabinet 8 includes a bubbler (Bub) 27 and a trap (TRAP) 28 for cleaning the waste gas discharged from each unit. Also, arranged below the bubbler (Bub) 27 are a power supply source (not shown), a chemical liquid chamber (not shown) for storing a pure water, an ammonia ($NH_3$) gas, etc., and a drain 29 for discharging the waste solution of the process liquid used in the SOD system 1 into, for example, a waste liquid processing apparatus (not shown).

The carrier station (CSB) 9 includes a table (not shown) on which is disposed a cassette having wafers W housed therein and a wafer transfer device (not shown) for transferring the wafer W between the cassette disposed on the table and the delivery unit (TRS) 25 arranged in the process section 7.

Where a porous low-k film is formed on the wafer W by a silk method or a speed film method in the SOD system of the construction described above, the wafer W is transferred in general into the cooling plate unit (CPL) 24 or 26 for controlling the temperature of the wafer W, into the coating unit (SCT) 12 for the coating with an adhesion promoter, into the hot plate unit (LHP) 19 or 23 for a low temperature, into the coating unit (SCT) 11 for the coating with a low-k liquid material, into the hot plate unit (LHP) 19 or 23 for a low temperature, into the baking unit (DLB) 22 (or the hot plate unit (OHP) for a high temperature) and, then, into the curing unit (DLC) 20 for receiving a prescribed processing in each process unit.

Figure 5:
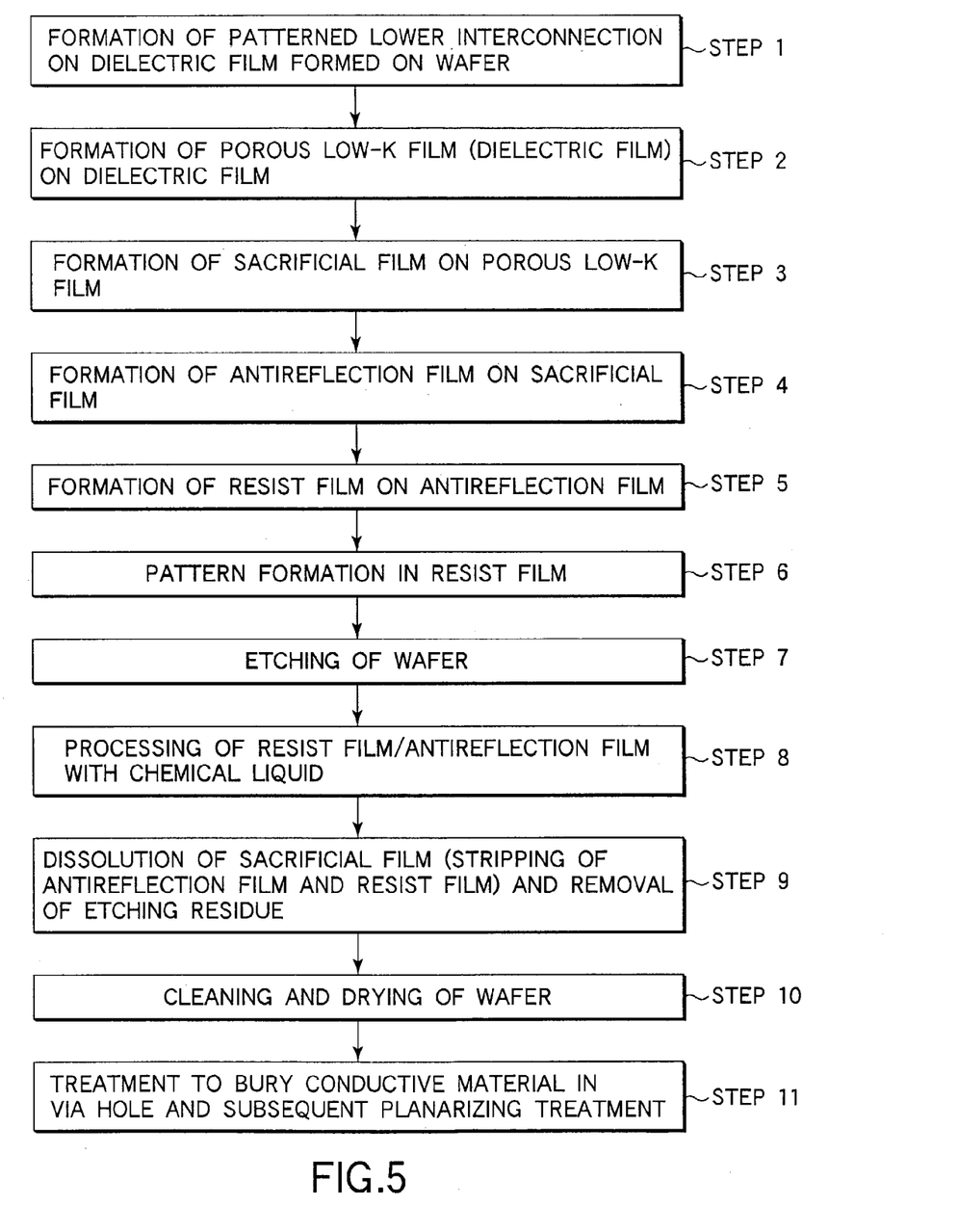
FIG. 5 is a flow chart showing the process of forming a trench interconnection element in a wafer according to one embodiment of the present invention.

The method of manufacturing a semiconductor device comprising a trench interconnection element of a single damascene structure will now be described, covering the case of using the damascene forming system of the construction described above. FIG. 5 is a flow chart showing the manufacturing process of a semiconductor device according to one embodiment of the present invention. Also, FIGS. 6A to 6J are cross sectional views schematically showing collectively the process of forming a trench interconnection element of a single damascene structure in the wafer W in accordance with the process steps shown in FIG. 5.

Figure 6A:
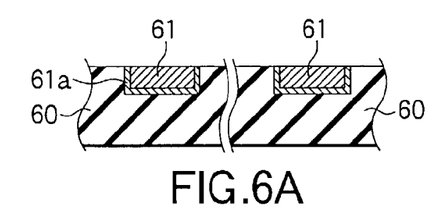
FIGS. 6A to 6J are cross sectional views collectively showing schematically the process of forming a trench interconnection element of a single damascene structure in a wafer by the process steps shown in FIG. 5.

In the first step, a patterned lower interconnection 61 is formed in a surface region of a dielectric film 60 formed on the wafer W (not shown) with a barrier metal layer 61a interposed between the dielectric film 60 and the lower interconnection 61, as shown in FIG. 6A (step 1). The material of the lower interconnection 61 is not particularly limited. However, the lower interconnection 61 generally consists of a copper (Cu) interconnection or an aluminum (Al) interconnection. Incidentally, it is possible for the lower interconnection 61 to be a interconnection formed in direct contact with the wafer W or to be a interconnection formed by burying a metal in a trench formed on the surface side of a trench interconnection element having a damascene structure.

Figure 6B:
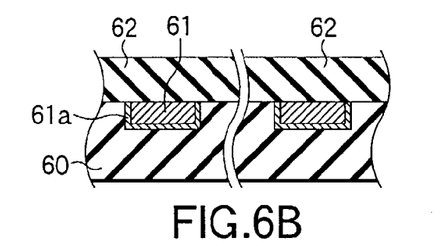

In the next step, a porous low-k film 62 is formed in a manner to cover the upper surfaces of the lower interconnection 61 and the dielectric film 60 by using the SOD system 1, as shown in FIG. 6B (step 2). To be more specific, the wafer W is held on the spin chuck arranged in the coating unit (SCT) 11, and a low-k liquid material is supplied onto the surface of the wafer W while rotating the spin chuck so as to centrifugally expand the low-k liquid material on the surface of the wafer W, thereby forming a film. Then, the wafer W is transferred into the hot plate unit (LHP) 19 or 23 for a low temperature, into the baking unit (DLB) 22 and, then, into the curing unit (DLC) 20 for receiving a heat treatment in each process unit. The coated film formed by the spin coating of the low-k liquid material is rendered porous during the process of the heat treatment so as to obtain the porous low-k film 62.

Incidentally, the process temperature in the baking unit (DLB) 22 is set higher than the process temperature in the hot plate units (LHP) 19, 23 for a low temperature and lower than the process temperature in the curing unit (DLC) 20. In this case, the components of the coated film are successively evaporated from the coated film in the order of the evaporating temperature, starting with the component having the lowest evaporating temperature. As a result, the properties of the porous low-k film are rendered satisfactory.

Figure 6C:
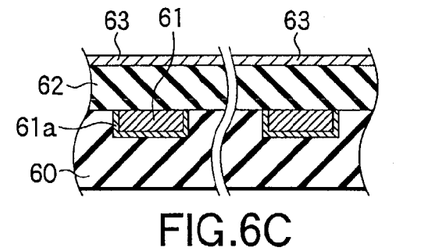

In the next step, a sacrificial film 63 is formed on the surface of the porous low-k film 62, as shown in FIG. 6C (step 3). The sacrificial film 63 is formed by using a sacrificial film coating unit included in the SOD system 1. To be more specific, the wafer W is held on the spin chuck arranged within the coating unit (SCT) 12, a chemical liquid for a sacrificial film is supplied onto the surface of the wafer W and the spin chuck is rotated, with a result that the chemical liquid is centrifugally expanded on the surface of the wafer W so as to form a film on the surface of the wafer W. After formation of the film, the wafer W is transferred into the hot plate unit (LHP) 19 or 23 for a low temperature and, then, into the baking unit (DLB) 22 for receiving a heat treatment in each process unit. A $SiO_2$ series material or a water-soluble material such as gelatin can be suitably used as the material of the sacrificial film 63.

Figure 6D:
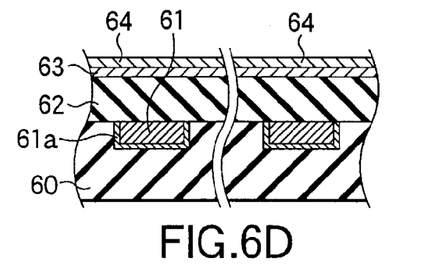

Incidentally, it is desirable to apply a heat treatment to the sacrificial film 63 under temperatures equal to or higher than the temperature for the heat treatment applied in the subsequent step to a BARC film 64 in order to prevent a mixed intermediate layer from being formed between the sacrificial layer 63 and the BARC film 64 in the subsequent step of coating the surface of the sacrificial layer 63 with a chemical liquid for forming the BARC film 64 or during the heat treatment applied to the coated film.

Also, as described herein later, the sacrificial layer 63 is dissolved in a chemical solution (sacrificial film dissolving solution) after formation of a via hole 62a so as to be removed from the wafer W. Therefore, it is necessary for the sacrificial film 63 to maintain the capability of being dissolved in the sacrificial film dissolving solution even after formation of the via hole 62a. Where a $SiO_2$ series material is used as the material of the sacrificial film 63 and a $SiO_2$ series material is also used for forming the porous low-k film 62, a combination of the sacrificial film material and the sacrificial film dissolving solution is selected such that the sacrificial film 63 can be easily dissolved in the sacrificial film dissolving solution and the porous low-k film is unlikely to be dissolved in the sacrificial film dissolving solution.

Further, where a gelatin film is used as the sacrificial film 63, it is necessary to pay attentions to the situation that, during the film-forming treatment, the aqueous solution having gelatin dissolved therein (i.e., a gelatin aqueous solution) is gelled if the temperature of the gelatin aqueous solution is rendered lower than a prescribed temperature so as to lower the fluidity of the gelatin aqueous solution. In other words, in forming a gelatin film of a uniform thickness by the spin coating of the wafer W with a gelatin aqueous solution, it is desirable to conduct sufficiently the temperature control of the gelatin aqueous solution and/or the wafer W so as to prevent the temperature of the gelatin aqueous solution from being made lower than a prescribed temperature.

The wafer W having the sacrificial film 63 formed thereon is transferred into the resist coating/developing system 2, and the BARC film 64 is formed on the sacrificial film 63 as shown in FIG. 6D (step 4). The method of forming the BARC film 64 is similar to the method of forming the sacrificial film 63.

Figure 6E:
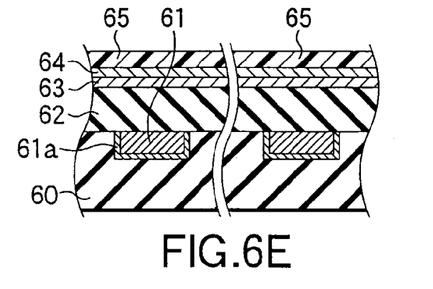
Figure 6F:
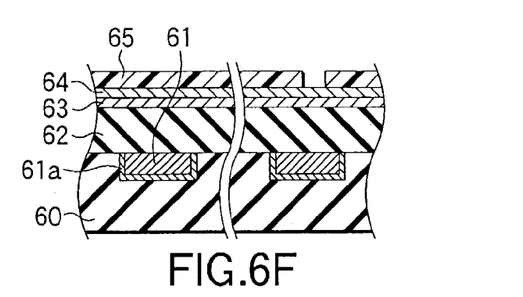
Figure 6G:
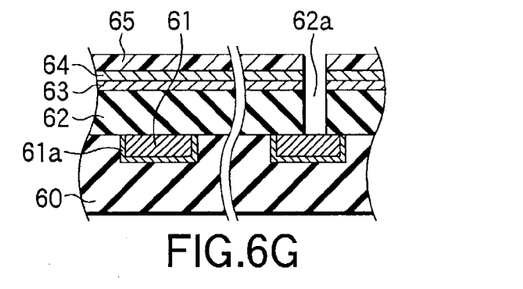

In the next step, a resist film 65 is formed on the BARC film 64 by a spin coating method, as shown in FIG. 6E (step 5). Then, the resist film 65 is exposed to light in a prescribed pattern, followed by developing the resist film so as to form a prescribed circuit pattern in the resist film 65 as shown in FIG. 6F (step 6). Further, the wafer W is transferred into the etching device 4 for etching the wafer W (step 7). As a result, the via hole 62a referred to previously is formed to reach the lower interconnection 61, as shown in FIG. 6G.

Figure 6H:
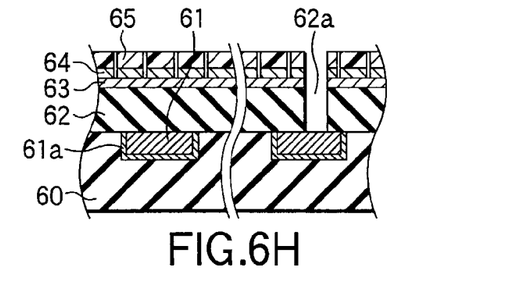

After etching, the wafer W is transferred into the resist denaturing system 6. In the resist denaturing system 6, the wafer W is treated with a chemical liquid (i.e., a denaturing chemical liquid) that does not corrode the porous low-k film 62 such as a hydrogen peroxide solution by using, for example, the chemical liquid process unit (step 8). As a result, pores or cracks are generated in the resist film 65 and the BARC film 64, as shown in FIG. 6H. These pores and cracks play the role of allowing the sacrificial film dissolving solution to permeate into the sacrificial film 63 so as to promote the dissolution of the sacrificial film 63 in the subsequent step of processing the wafer W with the sacrificial film dissolving solution (step 9).

For the processing in step 8, employed is, for example, a method that a plurality of wafers W are kept immersed in a denaturing chemical liquid for a prescribed period of time, a method that a single wafer W is held in substantially a horizontal posture, and a denaturing chemical liquid is kept retained on the surface of the wafer W for a prescribed period of time, or a method that a denaturing chemical liquid is sprayed onto a single wafer W or a plurality of wafers W that are kept rotated. In each of these methods, it is desirable to use a denaturing chemical liquid warmed to, for example, 50° C. to 60° C. so as to improve the through-put of the processing.

Figure 6I:
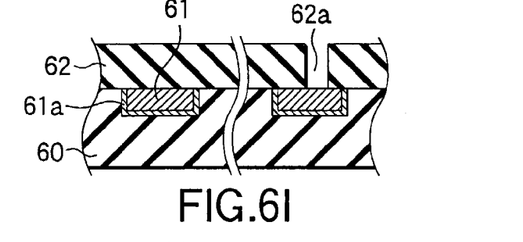

In the next step, the wafer W is transferred from the resist denaturing system 6 into the cleaning system 5. In the cleaning system 5, the sacrificial film 63 is dissolved in the sacrificial film dissolving solution so as to strip the BARC film 64 and the resist film 65 formed on the sacrificial film 63 from the wafer W (step 9). The sacrificial film dissolving solution permeates into the sacrificial film 63 through the pores or the like formed in the resist film 65 and the BARC film 64 so as to dissolve the sacrificial film 63, or dissolves the sacrificial film 63 from the side surface of the sacrificial film 63, i.e., on the side of the trench formed by the etching. As a result, the wafer W after the processing in step 8 is in the state that the via hole 62a is formed in the porous low-k film 62, as shown in FIG. 6I.

Where the sacrificial film 63 is formed of a $SiO_2$ series film, any of the chemical liquid selected from the group consisting of, for example, a diluted hydrofluoric acid, an ammonium fluoride series chemical liquid, an ammonium phosphate series chemical liquid, an ammonium oxalate series chemical liquid and an ammonium acetate series chemical liquid can be suitably used as the sacrificial film dissolving solution in the processing in step 8.

On the other hand, where the sacrificial film 63 is formed of a water-soluble film such as a gelatin film, it is possible to use a pure water as the sacrificial solution dissolving solution. In the case of using a pure water as the sacrificial film dissolving solution, it is possible to lower the processing cost because the pure water is cheaper than a chemical liquid such as a diluted hydrofluoric acid. Also, the use of a pure water permits ensuring the safety during the processing because a harmful substance is not contained in the pure water. Further, since the BARC film 64 and the resist film 65 mixed in the pure water are not dissolved in the pure water, it is possible to separate easily the mixed BARC film 64 and the resist film 65 from the water by using a filter or a precipitating vessel. It follows that the separated resist film 65, etc. can be disposed of easily with an environmental contamination problem fully taken into account. It is also desirable to use a functional water such as an activated water or an ozone water in place of the pure water so as to promote the dissolving rate of the sacrificial film 63.

The processing in step 9 can be performed in a batch process system in which a plurality of wafers W are processed simultaneously or in a single wafer process system in which the wafers W are processed one by one. In the case of the processing by the batch process system, wafers W arranged substantially in parallel a prescribed distance apart from each other are held for a prescribed time in a container housing a sacrificial film dissolving solution so as to dissolve the sacrificial film 63. As a result, the BARC film 64 and the resist film 65 are stripped from the wafer W. It is also desirable to apply an ultrasonic wave to the sacrificial film dissolving solution housed in the container or to stir the sacrificial film dissolving solution.

On the other hand, in the case of the processing by the single wafer process system, a puddle of the sacrificial film dissolving solution is kept formed on the surface of the wafer W for a prescribed time, followed by spurting the sacrificial film dissolving solution while rotating the wafer W. Alternatively, the wafer W is rotated while keeping the sacrificial film dissolving solution sprayed onto the surface of the wafer W. In this fashion, it is possible to remove the BARC film 64 and the resist film 65 by dissolving the sacrificial film 63. In the case of the processing by the single wafer process system, the cleaning and the spin drying of the wafer W can be performed successively after removal of the BARC film 64 and the resist film 65 from the wafer W.

In the case of employing the method of dissolving the sacrificial film 63 so as to remove the BARC film 64 as described above, it is possible to improve the through-put of the processing because the BARC film 64 and the resist film 65 can be removed simultaneously by a single processing. Also, since no damage is done to the porous low-k film 62, the accuracy in the shape of the via hole 62a can be maintained at a high level.

Incidentally, where the sacrificial film 63 is soluble in water and a hydrogen peroxide solution is used in the processing in step 8, which is carried out in the resist denaturing system 6 referred to above, it is possible to carry out the processing in step 8 and the processing in step 9 consecutively by transferring the wafer W from the etching device 4 into the cleaning system 5, if the cleaning system 5 is arranged to permit the switching between the supply of the hydrogen peroxide solution and the supply of the pure water, because an aqueous process solution is used in each of step 8 and step 9. In this case, the footprint of the damascene forming system can be diminished.

Figure 6J:
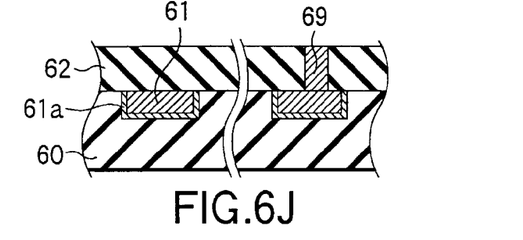

The wafer W is cleaned and dried after completion of the processing in step 9 (step 10). Then, a barrier metal layer (not shown) is formed by, for example, a CVD method on the inner wall of the via hole 62a after completion of the processing in step 9, followed by forming a thin film by, for example, a CVD method such that an electrically conductive material is buried in the via hole 62a and subsequently applying a planarizing treatment by, for example, a CMP method (step 11). As a result, a plug 69 electrically connected to the lower interconnection 61 is formed in the via hole 62a, as shown in FIG. 6J.

Figure 7A:
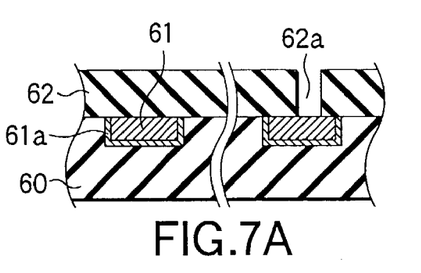
FIGS. 7A to 7F are cross sectional views collectively showing schematically the process of forming a trench interconnection element by a dual damascene method.
Figure 7B:
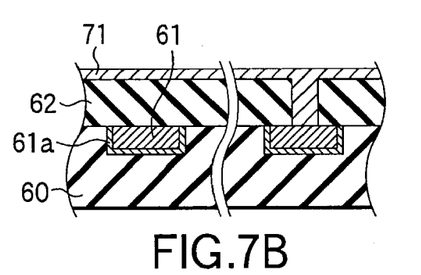

The technical idea of the present invention can also be applied to a dual damascene process as described in the following. Specifically, FIGS. 7A to 7F are cross sectional views collectively showing a process of forming a trench interconnection element by the dual damascene process. FIG. 7A shows the state equal to that of FIG. 6I. In other words, FIG. 7A shows that a via hole 62a is formed in the porous low-k film 62. In the dual damascene process, a sacrificial film 71 is formed on the porous low-k film 62 as shown in FIG. 7B without burying an electrically conductive material in the via hole 62a. In this case, the via hole 62a is filled with the sacrificial film 71.

Figure 7C:
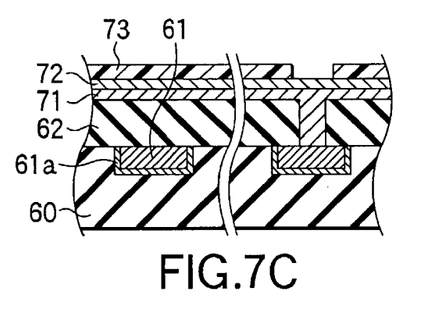
Figure 7D:
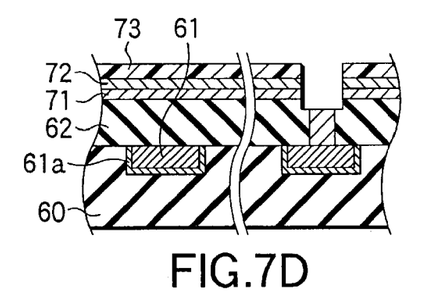

In the next step, a BARC film 72 is formed on the sacrificial film 71, followed by forming a resist film 73 on the BARC film 72 and subsequently exposing the resist film 73 to light in a prescribed pattern and, then, developing the resist film 73 so as to pattern the resist film 73, as shown in FIG. 7C. Further, the wafer W is etched until the upper portion of the porous low-k film 62 is removed in a prescribed height, as shown in FIG. 7D.

Figure 7E:
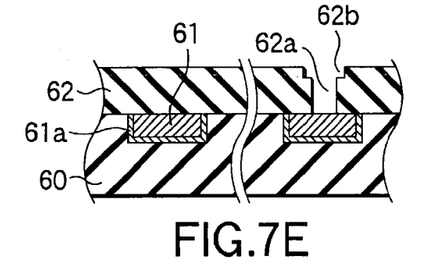

In the next step, the wafer W is treated with, for example, a hydrogen peroxide solution so as to form pores and cracks in the resist film 73 and the BARC film 72. The wafer W in this state is treated with a sacrificial film dissolving solution, with a result that the sacrificial film is dissolved in the sacrificial film dissolving solution so as to cause the BARC film 72 and the resist film 73 to be stripped from the wafer W, as shown in FIG. 7E. In addition, the sacrificial film 71 is also removed from within the via hole 62a, thereby forming the via hole 62a and a trench 62b.

Figure 7F:
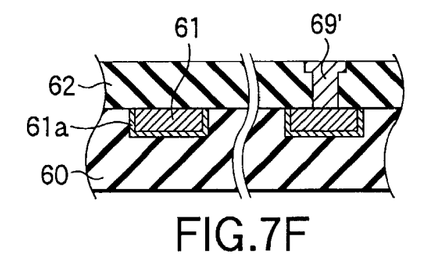

In the next step, the wafer W is washed and, then, dried. After the drying, a barrier metal layer (not shown) is formed by, for example, a CVD method on the inner walls of the via hole 62a and the trench 62b, followed by forming a thin film by a plating method and, for example, a PVD method such that an electrically conductive material is buried in the via hole 62a and the trench 62b and subsequently planarizing by, for example, a CMP method. As a result, formed is a plug 69' electrically connected to the lower interconnection 61 in a manner to fill the via hole 62a and the trench 62b.

In the conventional process corresponding to the steps leading from the state shown in FIG. 7A to the state shown in FIG. 7E, the BARC film 72 and the resist film 73 are formed on the dielectric film 62 without forming the sacrificial film 71, followed by patterning the resist film 73 and subsequently carrying out successively etching, the removal of the resist film 73 by the treatment with a chemical liquid, and the removal of the BARC film 72 by the ashing utilizing an oxygen-excited plasma. What should be noted is that the sacrificial film 71 is not formed in the conventional process referred to above. However, the particular conventional method gives rise to problems that a polymer residue is generated within the via hole 62a after the etching, and that the porous low-k film 62 around the via hole 62a incurs a damage during the ashing treatment.

However, in the method of the present invention comprising formation of the sacrificial film 71, the ashing is not carried out and, thus, the porous low-k film 62 around the via hole 62a does not incur a damage. It follows that it is possible to form the via hole 62a and the trench 62b with a high dimensional accuracy so as to make it possible to maintain a high device quality.

The present invention is not limited to the embodiment described above. For example, in the embodiment described above, the resist film and the BARC film are treated with a hydrogen peroxide solution before the sacrificial film is dissolved in the sacrificial film dissolving solution in order to promote the dissolving rate of the sacrificial film in the sacrificial film dissolving solution and to remove uniformly the sacrificial film. However, it is possible to omit the treatment with the hydrogen peroxide solution in the case where the dissolution of the sacrificial film proceeds from the side surface of the sacrificial film so as to make it possible to strip sufficiently the resist film and the BARC film.

Also, in the embodiment described above, a porous low-k film is formed as a dielectric film. However, it is possible to use a high density low-k film, which is widely used in this technical field, as the dielectric film. The high density low-k film is formed of, for example, a poly-organosiloxane crosslinked bisbenzo cyclobutene resin (BCB), a polyarylene ether resin (PAE) such as SilK (trade name, manufactured by Dow Chemical Inc.) or FLARE (trade name, manufactured by Honeywell Inc.), or an organic polysiloxane resin such as methyl silsesquioxane (MSQ).

Even in the case of using such a high density low-k film, it is possible to remove the resist film and the BARC film simultaneously by employing the technology of the present invention in place of the conventional processing in which the resist film is removed from the substrate by using a chemical liquid capable of dissolving the resist film. As a result, it is unnecessary to carry out the treatment for removing the BARC film, which was required in the conventional method, in the etching treatment carried out after the step of burying an electrically conductive material in the via hole. It follows that the through-put can be improved.

It should also be noted that, in the case of using a high density low-k film, it is possible to employ a method of processing the wafer W under a mixed gas atmosphere consisting of an ozone gas and a water vapor by using the VOS unit in place of a method of processing the wafer W with a chemical liquid such as a hydrogen peroxide solution by using the chemical liquid process unit. Naturally, it is also possible to form pores and cracks in the resist film and the BARC film even in the case of employing the method of processing the wafer W under the mixed gas atmosphere noted above. As a result, the permeation of the sacrificial film dissolving solution into the sacrificial film through the pores or the like formed in the resist film and the BARC film can be promoted so as to increase the dissolving rate of the sacrificial film. It is also possible to prevent the sacrificial film from being stripped nonuniformly.

Incidentally, the porous low-k film is generally deteriorated, if exposed to a mixed gas atmosphere consisting of an ozone gas and a water vapor. However, the particular processing method can be employed when it comes to a porous low-k film having a corrosion resistance when exposed to a mixed gas consisting of an ozone gas and a water vapor.

In the embodiment described above, a hydrogen peroxide solution is exemplified as a denaturing chemical liquid used for forming pores or the like in the resist film and the BARC film. Alternatively, it is also possible to use an amine series chemical liquid as another denaturing chemical liquid for the particular treatment. It should be noted, however, that a porous low-k film generally tends to be dissolved easily in an amine series chemical liquid. Therefore, the amine series chemical liquid is used suitably in the case of forming a dielectric film having a corrosion resistance when exposed to the amine series chemical liquid, e.g., in the case of forming a high density low-k film as the dielectric film.

Further, in the embodiment described above, the porous low-k film is formed by a spin coating method. However, the dielectric film such as a porous low-k film can be formed by, for example, a CVD method. The sacrificial film and the BARC film can be formed by another method other than a spin coating method. Further, in the embodiment described above, the BARC film is formed as an underlying layer of the resist film. However, it is also possible to form the resist film in direct contact with the sacrificial film without forming the BARC film on the sacrificial film. Still further, the substrate is not limited to a semiconductor wafer. It is possible to use various substrates including, for example, an LCD glass substrate and a ceramic substrate in addition to the semiconductor wafer.

It should be noted that the embodiments described above are simply intended to clarify the technical idea of the present invention. Naturally, the technical scope of the present invention should not be construed solely on the basis of the specific embodiment described above. In other words, the present invention can be worked in variously modified fashions on the basis of the spirit of the present invention and within the scope defined in the accompanying claims.

What is claimed is:

1. A method of manufacturing a trench structure for a device including a trench for an interconnection, comprising the steps of:
   forming a dielectric film on a substrate;
   forming a sacrificial film on the dielectric film;
   forming an etching mask having a prescribed pattern on the sacrificial film;
   etching the dielectric film though the etching mask to form a via hole in the dielectric film;
   denaturing the etching mask to form cracks or pores in the etching mask; and
   treating the substrate with a liquid capable of dissolving the sacrificial film and incapable of dissolving the dielectric film to cause the liquid to permeate into the sacrificial film through the cracks or pores formed in the etching mask, thereby dissolving the sacrificial film by the liquid to separate and remove the etching mask from the dielectric film.

2. A method of manufacturing a trench structure for a device including a trench for an interconnection, comprising the steps of:
   forming a dielectric film on a substrate;
   forming a sacrificial film on the dielectric film;
   forming an antireflection film on the sacrificial film;
   forming a resist film on the antireflection film;
   forming a prescribed circuit pattern in the resist film;
   denaturing the resist film and the antireflection film with a process solution incapable of eroding the dielectric film to form cracks or pores in the resist film and the antireflection film;
   etching the dielectric film to form a via-hole in the dielectric film, while using the resist film with the circuit pattern as an etching mask; and
   treating the substrate with a liquid capable of dissolving the sacrificial film and incapable of dissolving the dielectric film to cause the liquid to permeate into the sacrificial film through the cracks or pores formed in the resist film and the antireflection film, thereby dissolving the sacrificial film by the liquid to separate and remove the resist film and the antireflection film from the dielectric film.

3. The method of manufacturing a trench structure for a device according to claim 2, wherein the dielectric film is a porous film made of a material having a low dielectric constant.

4. The method of manufacturing a trench structure for a device according to claim 2, wherein the sacrificial film is soluble in water, and the liquid is water.

5. The method of manufacturing a trench structure for a device according to claim 4, wherein the sacrificial film is a gelatin film.

6. The method of manufacturing a trench structure for a device according to claim 2, wherein the step of forming cracks or pores in the resist film and the antireflection film is performed by processing the substrate with a process gas containing an ozone gas and a water vapor.

7. The method of manufacturing a trench structure for a device according to claim 2, further comprising the step of processing the substrate with a prescribed process solution so as to denature the resist film and the antireflection film after the step of the etching treatment and before the step of dissolving the sacrificial film.

8. The method of manufacturing a trench structure for a device according to claim 7, wherein the process solution is a hydrogen peroxide solution.

9. The method of manufacturing a trench structure for a device according to claim 2, wherein the substrate includes a metal interconnection of a prescribed pattern, which is formed in the vicinity of the surface, and the via hole is formed so as to be positioned on the metal interconnection.

10. The method of manufacturing a trench structure for a device according to claim 1, wherein the dielectric film is a porous film formed of a material having a low dielectric constant.

11. The method of manufacturing a trench structure for a device according to claim 1, wherein the sacrificial film is soluble in water and the liquid is water.

12. The method of manufacturing a trench structure for a device according to claim 11, wherein the sacrificial film is a gelatin film.

13. The method of manufacturing a trench structure for a device according to claim 1, wherein the step of forming cracks or pores in the etching mask is performed by processing the substrate with a process gas containing an ozone gas and a water vapor.

14. The method of manufacturing a trench structure for a device according to claim 1, wherein the step of forming cracks or pores in the etching mask is performed by processing the substrate with a process solution capable of denaturing the etching mask.

15. The method of manufacturing a trench structure for a device according to claim 14, wherein the process liquid is a hydrogen peroxide solution.

16. The method of manufacturing a trench structure for a device according to claim 1, wherein the substrate includes a metal interconnection of a prescribed pattern, which is formed in the vicinity of the surface, and the via hole is formed so as to be positioned on the metal interconnection.

* * * * *